US008922296B2

(12) United States Patent
Fraysse et al.

(10) Patent No.: US 8,922,296 B2
(45) Date of Patent: Dec. 30, 2014

(54) POWER AMPLIFIER DEVICE WITH REDUCED BULK (75) Inventors: Jean-Philippe Fraysse, Toulouse (FR); Michel Maignan, Pins Justaret (FR)

(73) Assignee: Thales, Neuilly-sur-Seine (FR)

( * ) Notice: Subject to any disclaimer, the term of this patent is extended or adjusted under 35 U.S.C. 154(b) by 496 days.

(21) Appl. No.: 13/266,105

(22) PCT Filed: Apr. 21, 2010

(86) PCT No.: PCT/EP2010/055300
§ 371 (c)(1),
(2), (4) Date: Oct. 24, 2011

(87) PCT Pub. No.: WO2010/122074
PCT Pub. Date: Oct. 28, 2010

(65) Prior Publication Data
US 2012/0056669 A1 Mar. 8, 2012

(30) Foreign Application Priority Data
Apr. 24, 2009 (FR) ...................................... 09 02006

(51) Int. Cl.
*H01P 5/12* (2006.01)
*H03F 3/60* (2006.01)

(52) U.S. Cl.
CPC *H01P 5/12* (2013.01); *H03F 3/605* (2013.01); *H03F 3/602* (2013.01)
USPC ............ 333/125; 333/128; 333/132; 333/134

(58) Field of Classification Search
USPC .................. 333/124–129, 132, 134
See application file for complete search history.

(56) References Cited

U.S. PATENT DOCUMENTS

| 4,092,616 A | 5/1978 | Osterwalder |
| 4,424,495 A * | 1/1984 | Bert ............................. 330/286 |

(Continued)

FOREIGN PATENT DOCUMENTS

| EP | 0032332 A1 | 7/1981 |
| JP | 63209313 A * | 8/1988 |

(Continued)

OTHER PUBLICATIONS

Denoual J. M. et al.: "16-Way Radial Divider/Combiner for Solid State Power Amplifiers in the K Band," Microwave Conference, 2008. EUMC 2008. 38th European, IEEE, Piscataway, NJ, USA, Oct. 27, 2008, pp. 345-348.

*Primary Examiner* — Robert Pascal
*Assistant Examiner* — Kimberly Glenn
(74) *Attorney, Agent, or Firm* — Baker & Hostetler LLP (57) ABSTRACT

An amplification device with reduced bulk including at least one plate parallel to a plane XY and at least two amplifier modules mounted on the plate, each amplifier module including an amplifier element, an input connection waveguide, and an output connection waveguide oriented in one and the same direction X corresponding to a direction of longitudinal propagation, the amplifier element having an input and output axis oriented in a direction Y perpendicular to the direction of propagation X, wherein the input connection waveguides of the amplifier modules are distinct, have different lengths and are mounted in parallel to one another, the output connection waveguides of the amplifier modules are distinct, have different lengths and are mounted in parallel to one another, and the sum of the lengths of the input and output guides of one and the same amplifier module is identical for each amplifier module.

13 Claims, 9 Drawing Sheets

(56) References Cited

U.S. PATENT DOCUMENTS

| | | |
|---|---|---|
| 5,736,908 A | 4/1998 | Alexanian et al. |
| 2004/0041658 A1 | 3/2004 | Adlerstein et al. |
| 2005/0057321 A1 | 3/2005 | Peterson |

FOREIGN PATENT DOCUMENTS

| | | |
|---|---|---|
| WO | 2006096771 A2 | 9/2006 |
| WO | 2009026704 A1 | 3/2009 |

* cited by examiner

Section I-I

FIG.3d

Section J-J

FIG.3e

Section I-I

FIG.4a

Section J-J

POWER AMPLIFIER DEVICE WITH REDUCED BULK

CROSS-REFERENCE TO RELATED APPLICATIONS

This application is a National Stage of International patent application PCT/EP2010/055300, filed on Apr. 21, 2010, which claims priority to foreign French patent application No. FR 09 02006, filed on Apr. 24, 2009, the disclosures of each of which are incorporated by reference in their entireties.

FIELD OF THE DISCLOSE SUBJECT MATTER

The present invention relates to a power amplification device having reduced bulk. It applies to the field of microwave semiconductor-based amplifiers and more particularly to power combining systems and notably to active antennas.

BACKGROUND

Decreases in the output power of semi-conductor elements together with increases in the operating frequency of amplification devices are leading to the need to combine several elementary semi-conductor amplifiers so as to achieve the output powers required by certain applications in the microwave field. In particular, for an active Ku-band antenna and to obtain a sufficient power level, it is often necessary to combine several amplifier modules in an antenna grid cell whose dimensions are of the order of a few centimeters.

Contemporary power combining systems based on corporate or radial architectures using lines or waveguides do not make it possible to efficiently combine elementary amplifiers in a confined environment with a rectangular-waveguide output interface able to cooperate with the downstream devices.

In a corporate structure combining several amplifiers, the amplifiers are disposed in parallel to one another and aligned along one and the same axis. The input and output waveguides of the amplifiers, the divider and the combiner are also aligned along this same axis. In the Ku-band and in rectangular guide technology, the width of such an amplification device is mainly constrained by the considerable size of the rectangular guides of the combiner. Thus, by taking into account only the value of the interior dimension according to a cross-section of a standardized Ku-band rectangular guide, equal to 1.9 cm, the width of an amplification device comprising for example eight amplifiers is at the minimum eight times as large, i.e. greater than 15 cm. This width being much greater than the dimensional constraints of an application relating to an active Ku-band antenna, this technique is therefore not suited to this type of application. For applications to higher frequencies, the size of the rectangular guides decreases and the width of the amplification device is no longer imposed by the combiner but by the width of the elementary amplifiers, decoupling capacitors and polarizing ports of these amplifiers. This width is therefore also too considerable with respect to the grid cell of an active antenna.

The spatial combining technique such as developed in U.S. Pat. No. 5,736,908 comprises several amplifier modules disposed on plates, overlaid in a rectangular waveguide. The input signal generated by a single source is apportioned among the amplifier modules by virtue of the spatial distribution of the energy of the signal and is recombined at the output once it has been amplified in accordance with the same principle. This solution makes it possible to perform in a single step on the one hand the combining of the signals and on the other hand the transitions between the planar-technology lines and the rectangular-waveguide output interface. By virtue of these characteristics, it makes it possible to minimize the combining losses and the bulkiness of the structure. However, this combining technique, such as described in the prior art, exhibits drawbacks and limitations.

Indeed, the number of plates stacked in a rectangular waveguide and the number of associated amplifiers on one and the same plate decrease with the reduction in the size of the rectangular waveguides which is imposed by the increase in operating frequency.

For applications to high frequencies such as for example in the Ka-band, the standardized size of the rectangular guides is much smaller than the size of the amplifier modules, thereby making it necessary to have long transmission lines for linking the amplifier modules to the transitions of the spatial divider excited by a single source and to the transitions of the spatial combiner. These transmission lines are very penalizing in terms of losses and the dividing and combining efficiency is degraded. A structure with four plates would be the best adapted in terms of compactness for combining eight elementary amplifiers in the case of an active Ku-band antenna. However, in this configuration, this type of architecture exhibits unfavorable thermal management in respect of the plates located at the center of the structure and a lack of isolation between the combined amplifiers possibly giving rise in certain cases to an instability of the amplification device.

Document WO 2006096771 describes another spatial combining technique in which the axes of the amplifiers are disposed along a direction perpendicular to the input and output waveguides, but for applications to high frequencies, in the Ka-band for example, the long input transmission lines are penalizing in terms of division losses.

SUMMARY

The aim of the invention is to produce an amplification device with reduced bulk not comprising the drawbacks of the existing devices and making it possible to combine notably a large number of amplifiers in the grid cell of an active Ku-band antenna of dimensions of the order of a few centimeters with a high combining efficiency and little division loss.

Accordingly, the invention relates to an amplification device with reduced bulk comprising at least one plate parallel to a plane XY and at least two amplifier modules mounted on the plate, each amplifier module comprising an amplifier element, an input connection waveguide and an output connection waveguide oriented in one and the same direction X corresponding to a direction of longitudinal propagation, the amplifier element having an input and output axis oriented in a direction Y perpendicular to the direction of propagation X, characterized in that the input connection guides of the two amplifier modules are distinct, have different lengths and are mounted in parallel to one another, the output connection guides of the two amplifier modules are distinct, have different lengths and are mounted in parallel to one another, and in that the sum of the lengths of the input and output guides of one and the same amplifier module is identical for each amplifier module, the amplifier modules being mounted in parallel in at least one row, the input waveguides of the amplifier elements of the row being preceded by a power divider and the output waveguides of the amplifier elements of the row being linked to an output power combiner, so that the signals transmitted by the output connection waveguides (13a, 13b) to the power combiner (16) are in phase.

Advantageously, the input waveguides, respectively the output waveguides, of the amplifier elements of the row adjoin one another and the amplifier elements of the row are offset with respect to one another in the two perpendicular directions X and Y.

Advantageously, the input divider and/or the output combiner can comprise a resistive septum which extends walls separating the connection waveguides.

Advantageously, the amplification device furthermore comprises an input transition disposed between each input connection guide and the corresponding amplifier element and an output transition disposed between each output connection guide and the corresponding amplifier element.

According to one embodiment, the amplification device comprises two distinct amplification rows, each amplification row comprising the same number of amplifier modules, the amplifier modules of the first row being mounted symmetrically with respect to the amplifier modules of the second row on either side of an axis of symmetry parallel to the direction of propagation.

Advantageously, each amplifier module of the first row comprises an amplifier element having an input and output axis oriented along the direction Y and aligned respectively with an input and output axis of an amplifier element of an amplifier module of the second row.

Advantageously, the output connection waveguides of the amplifier elements of all the amplifier modules of the two rows are distinct, adjoining one another and linked to an output power combiner, common to all the output connection waveguides.

Advantageously, the amplification device furthermore comprises a first input power divider having two outputs linked respectively to the two amplification rows across two transitions and each amplification row comprises a second power divider having outputs linked respectively to each input connection waveguide of the corresponding amplifier modules. The first input power divider can comprise an input of microstrip type.

According to one embodiment, the amplification device comprises at least two amplifier modules overlaid one above the other, the two amplifier modules being disposed on at least two distinct plates overlaid one above the other and comprising one and the same number of amplifier modules and the two overlaid amplifier modules have an input guide and an output guide in common.

Advantageously, the transition elements are chosen from among fin lines, or plungers comprising a metallization line placed on a substrate, or mechanical plungers using a glass bead.

Preferably, the input and output connection waveguides are metallic waveguides with rectangular cross-section. Furthermore, the power divider and the power combiner can also be metallic waveguides with rectangular cross-section.

Preferably, each input connection waveguide is equipped with a phase adjustment element.

Advantageously, the amplification device comprises an opto-electronic feed device connected at the input of the amplification device by way of an optical fiber and of a transition.

BRIEF DESCRIPTION OF THE DRAWINGS

Other features and advantages of the invention will be clearly apparent in the subsequent description given by way of purely illustrative and nonlimiting example, with reference to the appended schematic drawings which represent.

DETAILED DESCRIPTION

Figure 1:
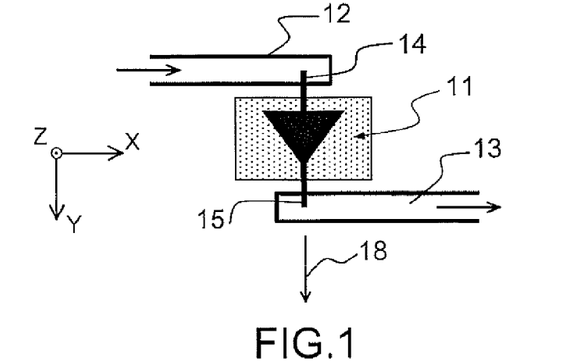
FIG. 1: a diagram of a first exemplary amplifier module, according to the invention.

The amplifier module represented in FIG. 1 comprises an amplifier element 11, an input connection waveguide 12, an output connection waveguide 13, an input transition 14 ensuring the transition between the input guide and the amplifier module, an output transition 15 ensuring the transition between the output guide and the amplifier module. The input and output waveguides 12, 13 are oriented in one and the same direction X corresponding to a longitudinal direction of propagation and have a cross-section which may for example be rectangular. The amplifier element 11 has an input and output axis 18 oriented in a direction Y perpendicular to the direction of longitudinal propagation. The input transition 14 and output transition 15 are perpendicular to the direction of longitudinal propagation X and ensure the electrical matching between the amplifier element 11 and the rectangular input waveguide 12 and output waveguide 13.

Figure 2:
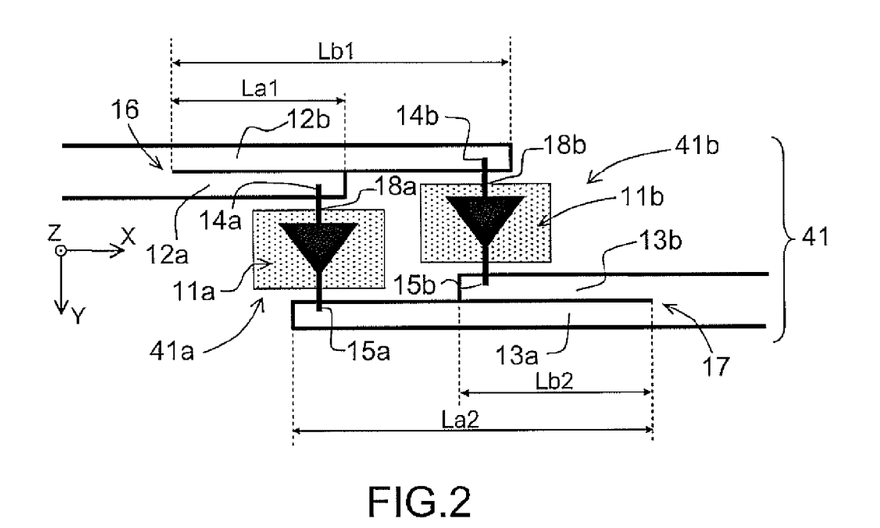
FIG. 2: a diagram of a first exemplary amplification device comprising two amplifier modules combined on a plate and on a row, according to the invention.

FIG. 2 represents a diagram of a first exemplary amplification device according to the invention, comprising two amplifier modules constituting two amplifying pathways. The two amplifier modules 41a, 41b are mounted in parallel on one and the same plate XY and in one and the same row 41 in such a way that the two input waveguides 12a, 12b, respectively the two output waveguides 13a, 13b, of the two amplifier elements 11a, 11b are adjoining one another and that the two amplifier elements 11a, 11b, are not aligned on one and the same axis but offset with respect to one another in the two perpendicular directions X and Y. The amplifier elements 11a, 11b have distinct input waveguides and distinct output waveguides to which they are respectively connected by way of the input transitions 14a, 14b and output transitions 15a, 15b, and respectively an input and output axis 18a, 18b oriented along a direction Y perpendicular to the direction of propagation X. The two input waveguides 12a, 12b, respectively the two output waveguides 13a, 13b, of the two amplifier elements 11a, 11b have different lengths La1, La2, respectively Lb1, Lb2, along the longitudinal propagation axis X but the sum of the lengths of the input and output waveguides of one and the same amplifier module is identical for all the amplifier modules:

$$La1+La2=Lb1+Lb2$$

Figure 3A:
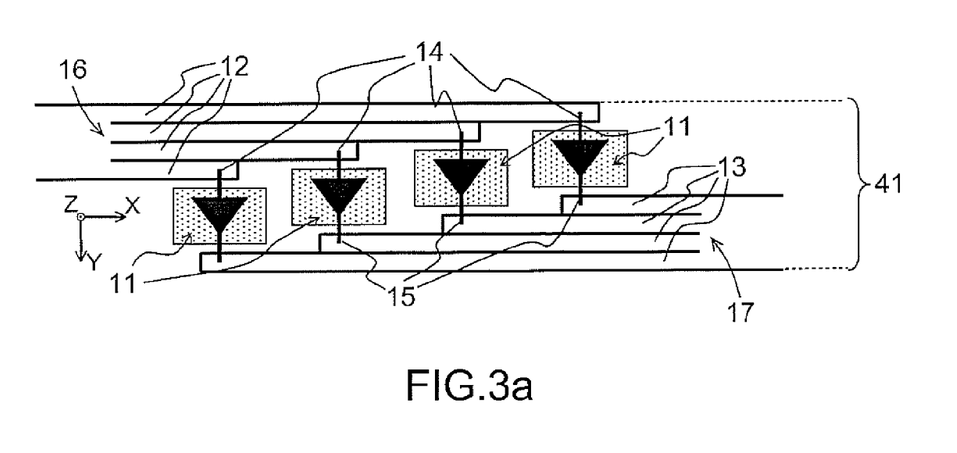
FIGS. 3a to 3e: two diagrams and three sectional views, longitudinal and transverse, on the sectional plane I-I and the sectional plane J-J of a second exemplary amplification device comprising four amplifier modules combined on a plate and on a row, according to the invention.

The two input waveguides 12a, 12b of the two amplifier elements 11a, 11b are preceded by a power divider 16 making it possible to divide a microwave input signal, for example in the 10.5 GHz and 14 GHz band, into two components propagating in the two input connection waveguides 12a, 12b and the two output waveguides 13a, 13b of the two amplifier elements 11a, 11b are linked to a power combiner 17 making it possible to recombine the output microwave signals amplified by each amplifier element. Each amplifier element comprises a polarization circuit with decoupling capacitors 10 as represented for example in FIG. 3c showing four amplifier modules combined in one and the same row and constituting four amplifying pathways.

The power divider 16 is embodied using metal waveguide technology and consists of an input and of two outputs in rectangular guide form. The divider may be of "septum divider" type. In this type of divider, the two output guides are generally separated at the location of the division by a thin wall constituting the "septum" (Latin term) which may be metallic or resistive. The power combiner 17 is also embodied using metal waveguide technology and consists of two inputs and of an output in rectangular guide form and may be of "septum combiner" type. The divider 16 and the combiner 17 of "septum divider" and "septum combiner" types make it possible to divide and combine the microwave signals within a reduced bulk with low losses. The sum of the lengths of the input waveguides 12a, 12b and output waveguides 13a, 13b being identical for the two amplifier modules 41a, 41b, the signals at the input of the combiner are in phase and the recombining of the signals amplified by the two amplifying pathways is carried out in phase without the addition of a phase shifter. The number of amplifier modules combined in this way is not limited to two.

As represented in the various diagrams and sectional planes of FIGS. 3a to 3e showing four amplifier modules combined in one and the same row and constituting four amplifying pathways, it is possible to combine a large number of amplifier modules comprising amplifier elements offset with respect to one another in the two perpendicular directions X and Y, the input waveguides, respectively output waveguides of the various amplifier elements adjoining one another and having different input and output lengths and such that the sum of the lengths of the input and output waveguides of one and the same amplifier module is identical for all the amplifier modules. Thus, on each amplification pathway, the electrical path corresponding to the input guide is different from the electrical path corresponding to the output guide but for all the pathways, the sum of the electrical paths corresponding to the input and output guides of one and the same pathway is identical, thereby making it possible, at output, to have an identical phase for all the signals and to recombine all the microwave signals in phase without the addition of a phase shifter.

Figure 3B:
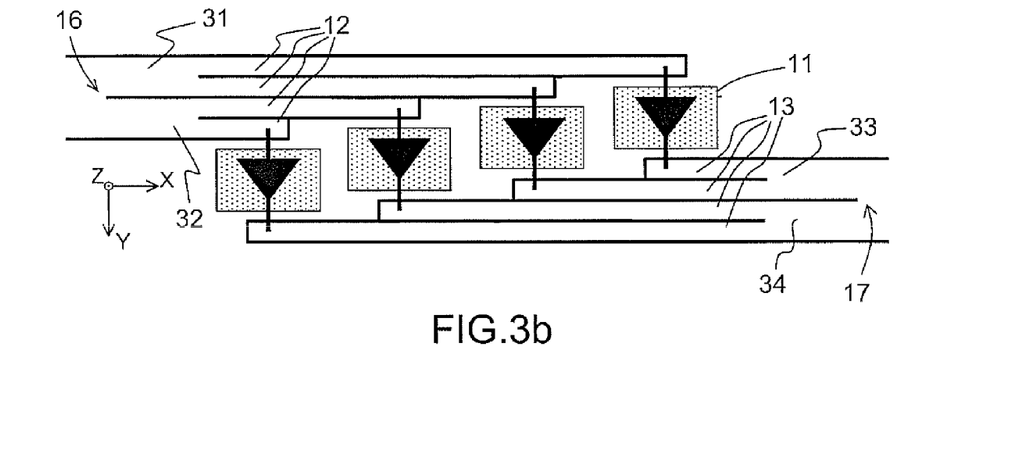
Figure 3C:
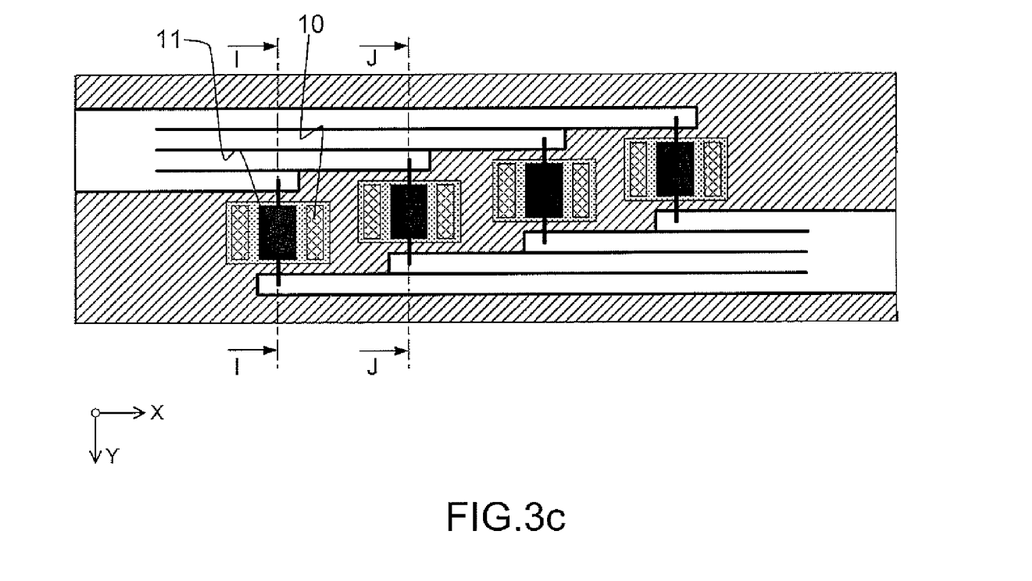
Figure 3D:
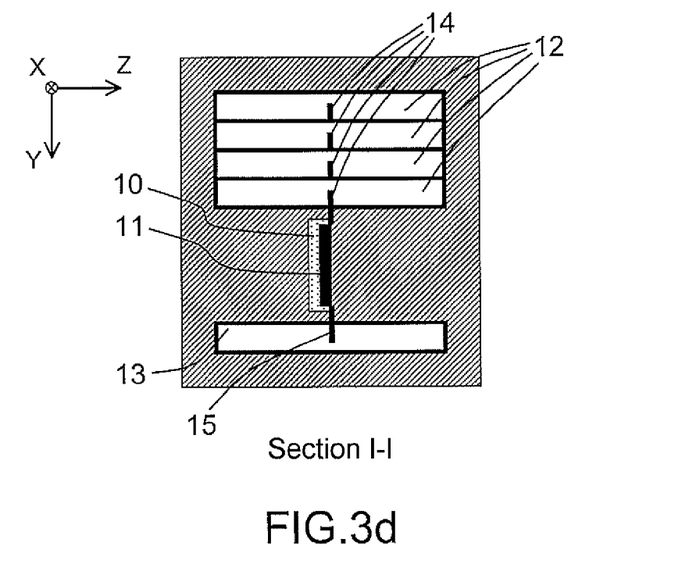
Figure 3E:
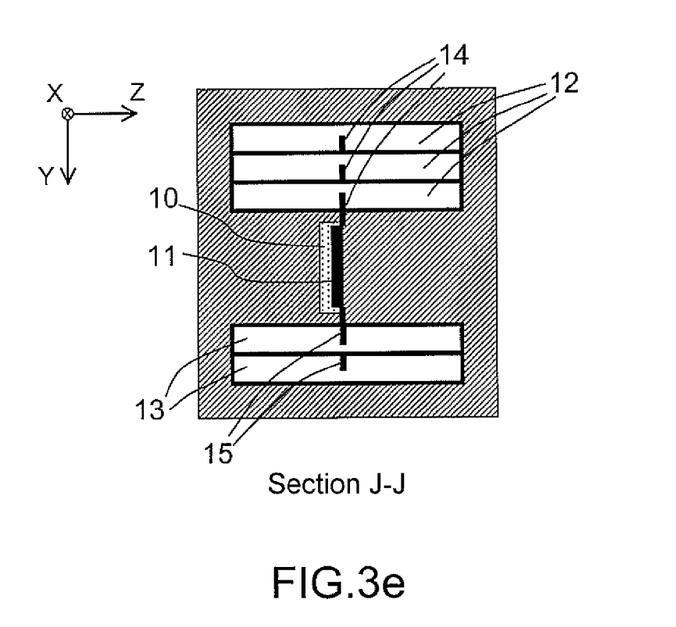

The embodiment represented in FIG. 3b shows an amplification device comprising an input divider 16 and an output combiner 17 with two stages. In this embodiment, the input signal is divided in two steps. In a first step the signal is apportioned between two intermediate rectangular waveguides 31, 32, and then in a second step, each of the signals propagating in the two intermediate rectangular waveguides 31, 32 are again divided into two and apportioned among the four input connection waveguides 12 of the four amplifier elements 11. At the level of the output combiner 17, the four signals amplified by the four amplification pathways are combined pairwise in phase in two steps. In a first step, the four output signals propagating in the four output connection guides 13 of the amplifiers 11 are recombined in phase in two intermediate rectangular output waveguides 33, 34, and then in a second step, each of the signals propagating in the two intermediate rectangular waveguides 33, 34 are again combined in phase in the output waveguide of the combiner 17.

Figure 4A:
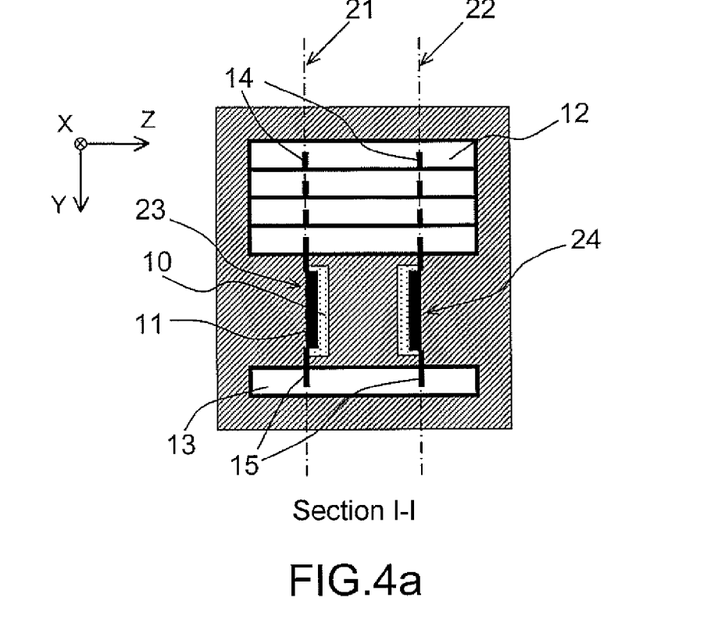
FIGS. 4a and 4b: two transverse sectional views on the sectional plane I-I and the sectional plane J-J of an amplification device comprising two rows of amplifier modules disposed on two overlaid plates, according to a variant embodiment of the invention.
Figure 4B:
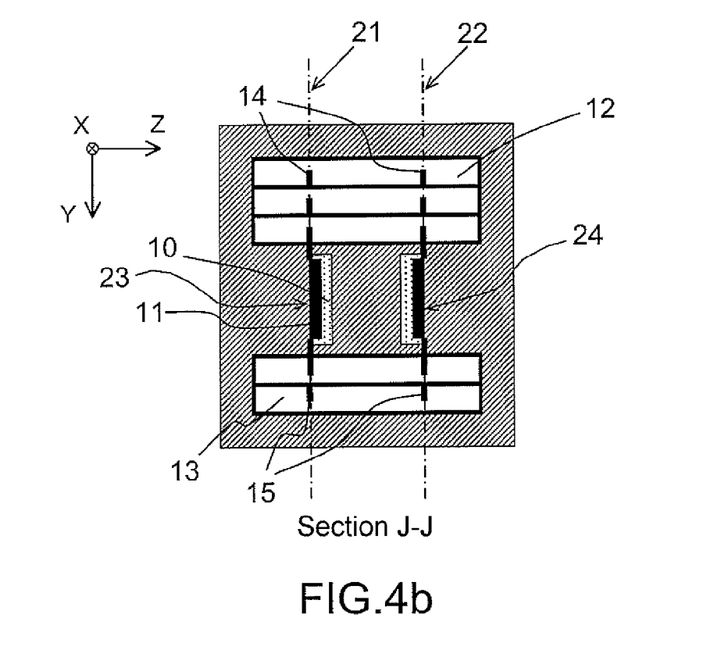

According to a first variant embodiment of the invention, the amplifier modules of FIG. 3a may be grouped together in pairs, the modules of each pair being disposed on two distinct and overlaid plates 21, 22 as shown by the transverse sectional views on the sectional plane I-I and the sectional plane J-J of FIGS. 4a and 4b. In this case, each pair comprises two overlaid amplifier modules 23, 24 which have an input connection waveguide and an output connection waveguide in common. One and the same input connection waveguide therefore excites two elementary amplifiers by way of two input transitions. At output, the two elementary amplifiers are respectively connected to the same output connection guide by way of two output transitions. Placing the two plates opposite one another makes it possible to remove the heat flux to the exterior. In the same manner, a greater number of amplifier modules than two can be grouped together, the modules grouped together being disposed on distinct plates overlaid one above another.

Figure 5A:
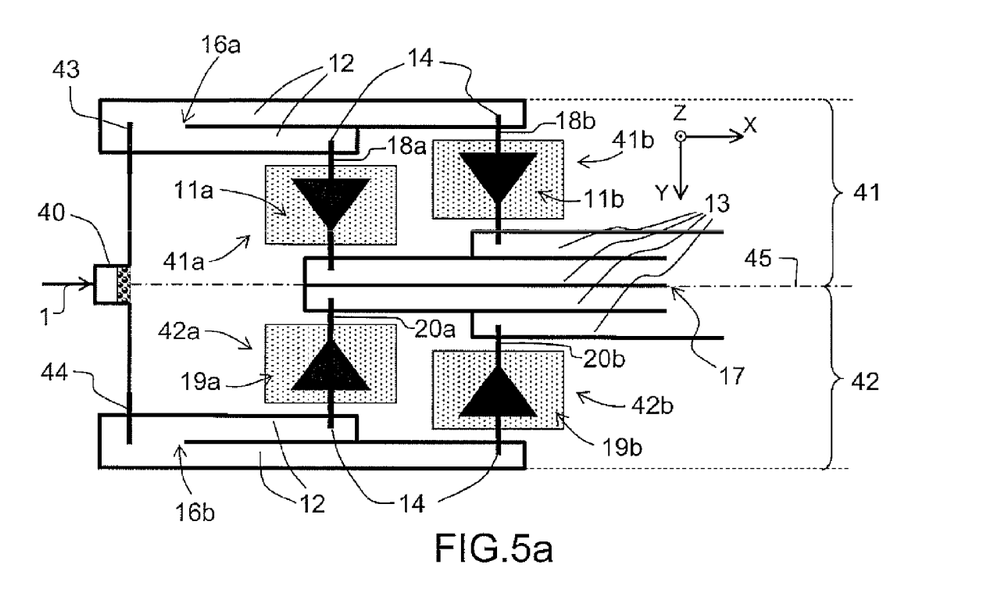
FIGS. 5a and 5b: two diagrams of third and fourth exemplary amplification devices comprising several amplifier modules combined on two rows of one and the same plate, according to a variant embodiment of the invention.

A third example represented schematically in FIG. 5a shows an amplification device comprising four amplifier modules combined on one and the same plate, according to a second variant embodiment of the invention.

The four amplifier modules are combined pairwise on two distinct amplification rows 41, 42 parallel to the propagation axis, each amplification row comprising the same number of amplifying pathways, for example two pathways as in FIG. 5a, each amplifying pathway comprising an amplifier module. The amplification device comprises a first input power divider 40, of planar type, whose access port is realized by an input of microstrip type which makes it possible to divide an input microwave signal 1 into two components so as to illuminate two rectangular input waveguides linked respectively to one of the two amplification rows, across two transitions 43, 44. Alternatively, the power divider 40 could be a divider septum. In each amplification row 41, 42, the two amplifying pathways are preceded by a second power divider 16a, 16b comprising two outputs linked respectively to each input connection waveguide 12 of the corresponding amplifier modules 41a, 41b, 42a, 42b. The second power divider 16a, 16b, for example of divider septum type, makes it possible for the component of the microwave signal arising from one of the transitions 43, 44 to be divided a second time into two new components propagating respectively in the two input connection waveguides 12 of the two corresponding amplifying pathways. The two amplifier modules 41a, 41b of the two amplifying pathways of the first row 41 are mounted symmetrically with respect to the two amplifier modules 42a, 42b of the second row 42, on either side of an axis of symmetry 45 parallel to the direction of propagation X. Each amplifier module 41a, 41b of the first row 41 comprises an amplifier element 11a, 11b having an input and output axis 18a, 18b oriented along the direction Y and aligned respectively with an input and output axis 20a, 20b of an amplifier element 19a, 19b of an amplifier module 42a, 42b of the second row 42. The output connection waveguides 13 of all the amplifier elements of the two rows are separated and adjoining one another, allowing the recombining in phase of all the signals at the output of the output power combiner 17 common to all the output waveguides of the two rows 41, 42.

The signals propagate in the rectangular connection waveguides 12 from the output transitions 43, 44 of the input divider 40 and after division across the second divider 16*a*, 16*b* of each row 41, 42 toward input transition elements 14 of the amplifier modules 41*a*, 41*b*, 42*a*, 42*b*. After amplification, the signals propagate in the output connection waveguides up to the power combiner 17 where they are recombined in phase.

Figure 5B:
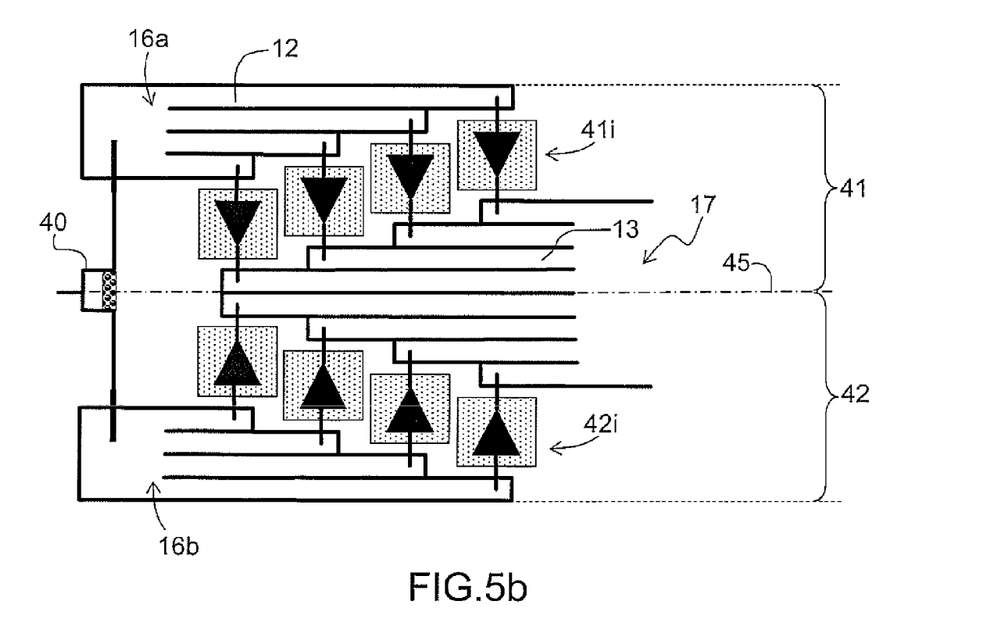

The number of amplifier modules in each row is not limited to two. As represented in FIG. 5*b* which shows a combination of four amplifier modules 41*i*, 42*i* per row 41, 42, it is possible to combine a large number of amplifier modules in each row.

Figure 6:
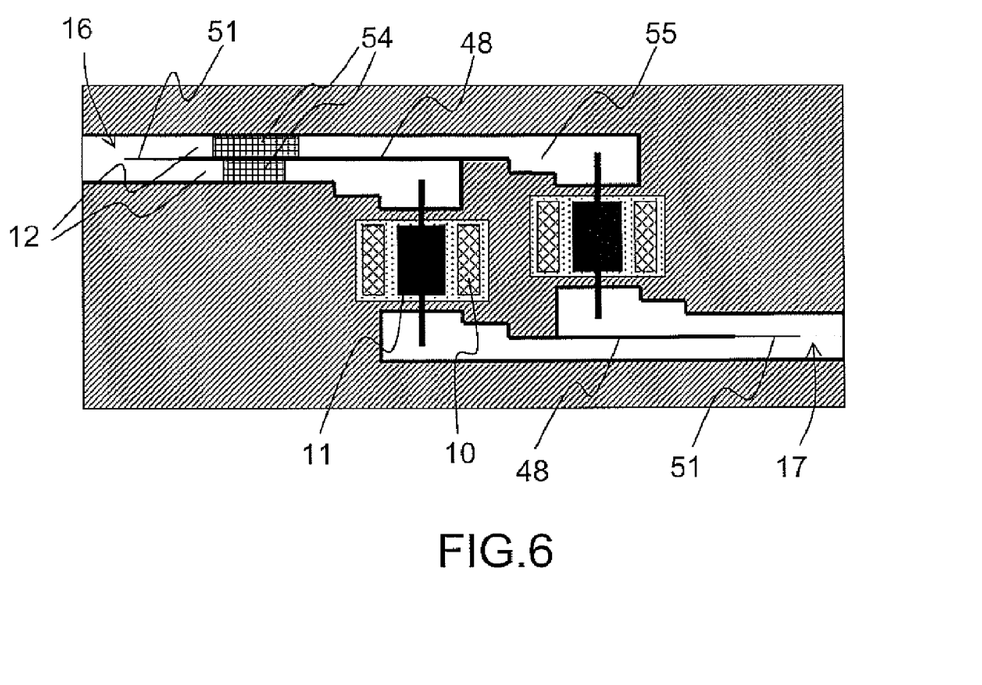
FIG. 6: a longitudinal sectional view of a variant embodiment of the invention comprising a row of two amplifier modules combined on a single plate, according to the invention.
Figure 7A:
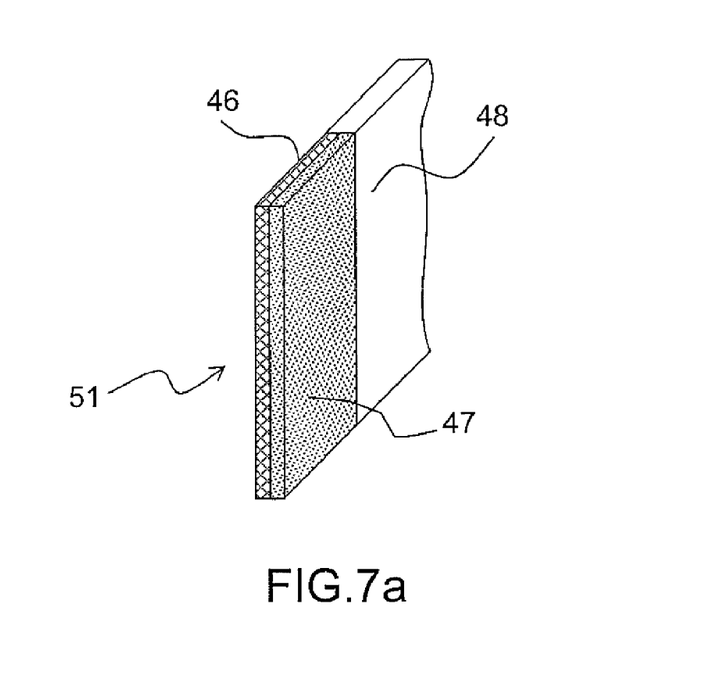
FIGS. 7a, 7b and 7c: a schematic detail view of an exemplary septum and two schematic detail views of two examples of combiners of septum type, respectively with one stage and with two stages, according to the invention.
Figure 7B:
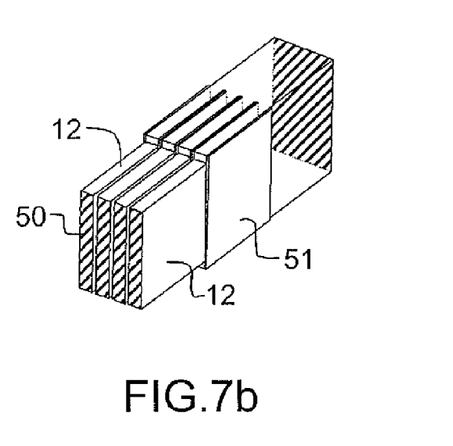

In the embodiment represented in FIG. 6, the amplification device comprises portions of matching guides 55 placed in the input and output connection waveguides just upstream and downstream of each amplifier element. Furthermore, the input divider 16 and the combiner 17 each comprise a resistive septum extending, at input and at output, the metallic walls 48 separating the rectangular connection waveguides. As represented for example in FIG. 7*a*, each septum comprises at least one wall 51 furnished with a resistive surface the function of which is to ensure the insulation between the amplifier modules so as to improve the electrical stability of the amplification device and to simplify the adjustment of its phase since it makes it possible to adjust each amplifier module separately from the other modules. The resistive surface can consist of a resistive film placed in a plane of symmetry between two identical substrates 46, 47, for example of ceramic such as alumina or aluminum nitride. As represented in FIG. 7*b*, in the one-stage septum, the resistive surfaces of the walls 51 are all mounted at one and the same distance from the input 50 of the combiner or the divider.

Figure 7C:
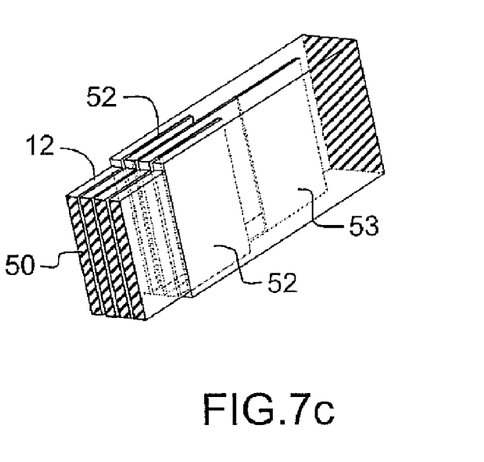

Alternatively, for an amplification device comprising more than two amplifier modules in one and the same row, like the example represented in FIG. 3*b*, it is possible to use a septum comprising several stages, for example two stages as shown by the combiner of FIG. 7*c*, comprising first walls 52 furnished with resistive films disposed at a predetermined distance from the input 50 of the combiner, and other walls 53 furnished with resistive films disposed in an offset manner and set back with respect to the resistive films of the first walls 52. A divider comprising a septum has a similar configuration by inverting the input and the output with respect to the combiner. The two-stage septum of the divider 16 carries out a division of the input signal in two successive steps making it possible to obtain four components of the signal, each component being directed in one of the four input connection guides of four amplification modules: a first division of the signal into two components is carried out by virtue of a first wall 52 of the first septum stage, followed by a second division of each of the components into two other components by virtue of two other walls 53 of the second septum stage. In the output guides 13, the combiner 17 also comprises a two-stage septum making it possible to recombine the signals in two successive steps by virtue of the walls 53, 52 of the septum. The number of walls of the septum of the divider and of the combiner is not limited to three as represented in the exemplary embodiments but may be adapted as a function of the number of signal components desired for the various amplifying pathways of the amplification device.

The adjustment of the phase may be carried out by phase adjustment elements 54 mounted in each of the input connection guides 12 so as to control the relative phase between the signals propagating in the connection waveguides 12 in such a way as to ensure a recombining in phase of these signals in the output waveguide once they have been amplified by the amplifier modules. This functionality makes it possible to minimize the combining losses by eliminating the losses induced by a phase imbalance of combined signals due to manufacturing tolerances. The phase adjustment elements 54 may be embodied for example as dielectric elements of diverse shapes. Alternatively, the phase shift elements may be phase shifters having dielectric wafers or laminas that can be adjusted with micrometer screws. The depths to which these dielectric elements are pushed into the connection guides 12 then make it possible to alter the phases of the signals propagating in the connection guides 12.

Figure 8A:
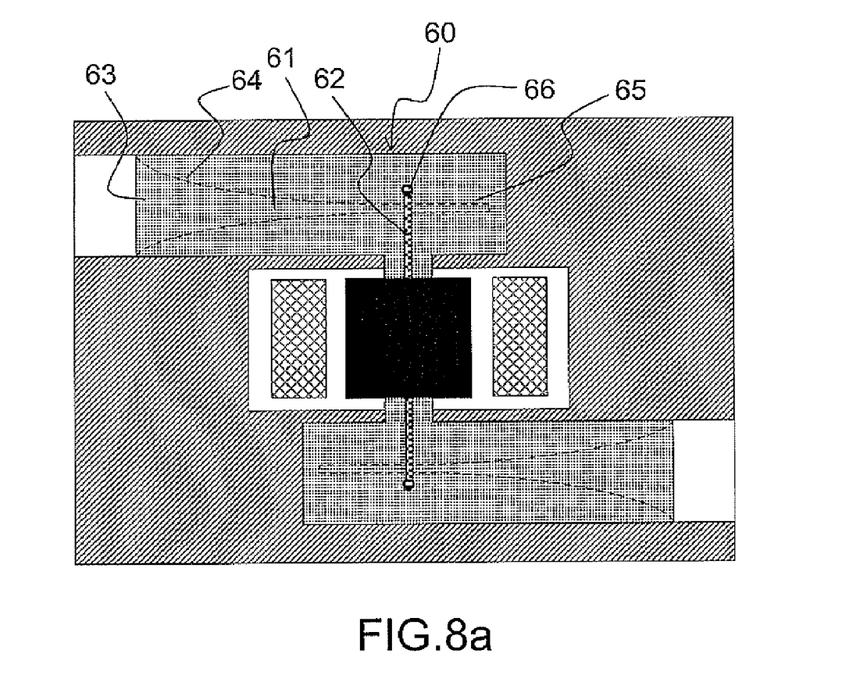
FIGS. 8a to 8d: four sectional schematic views of examples of transitions, according to the invention.

The input and/or output transitions may be produced for example by using a fin line 60 furnished with a slot 61 associated with a microstrip line 62, as represented in FIG. 8*a*. The signal propagating in the input connection waveguide is picked up by a Vivaldi antenna 64 formed on the lower face of the substrate 63. The edges of metallizations on the lower face of the substrate 63 are demarcated by dots. At the output of the Vivaldi antenna, an open-circuit λ/4 stub 65 and a metallized hole 66 linking the two metallized faces of the substrate makes it possible to pass from the slot mode to the microstrip mode propagating in the microstrip line 62.

Figure 8B:
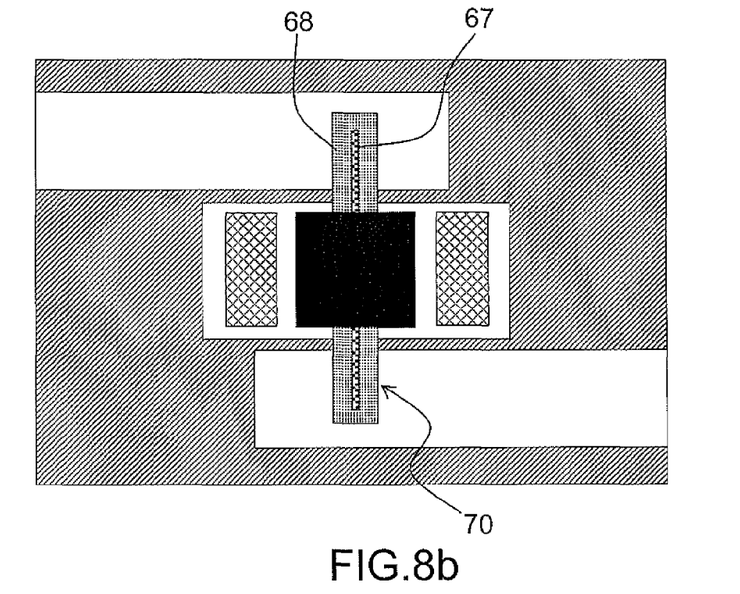
Figure 8C:
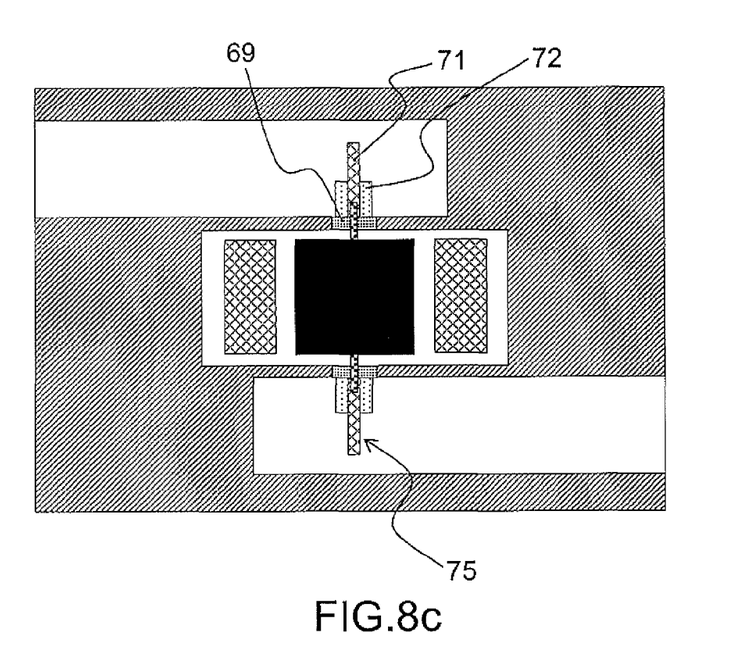

Alternatively, as represented in FIG. 8*b*, the transitions may be embodied by using a plunger 70 comprising a metallization line 67 placed on a substrate 68 or, as represented in FIG. 8*c*, by using a mechanical plunger 75 using a glass bead 69, a cylinder 71 extending the core of the glass bead and a dielectric 72 contributing to the matching of the transition.

Figure 8D:
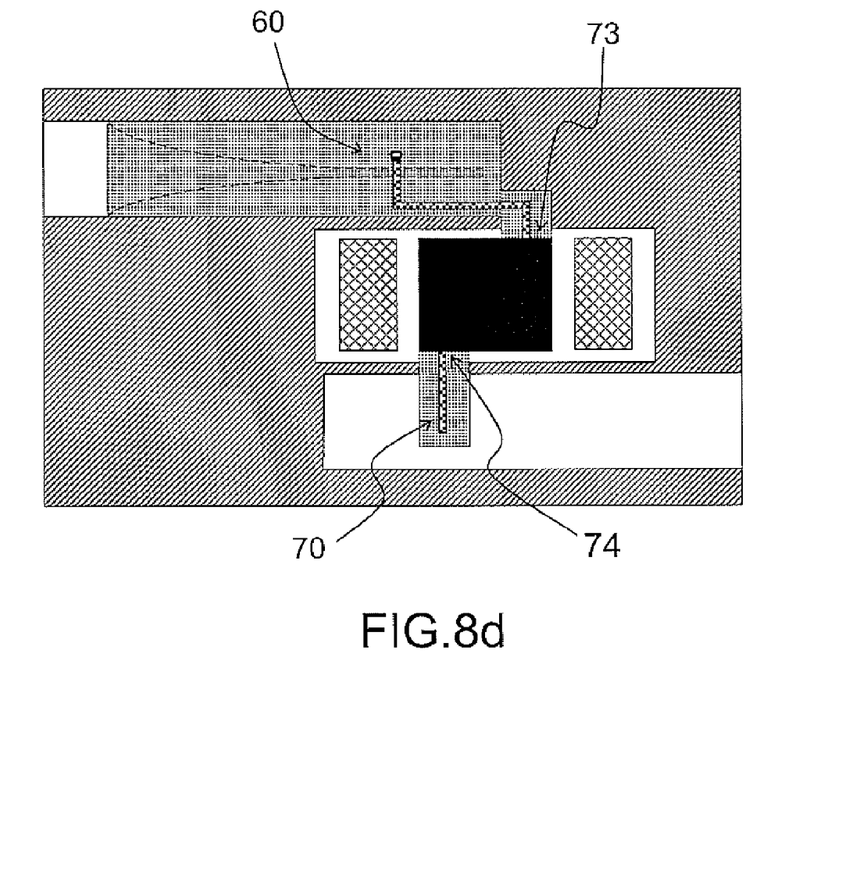

Alternatively, it is possible to combine, at input and at output, two types of different transitions. For example, as represented in FIG. 8*d*, it is possible to use an input transition comprising a fin line 60 and an output transition comprising a plunger 70 mounted on a substrate. In this figure, the input 73 and the output 74 of the amplifier element are not on the same axis.

Figure 9:
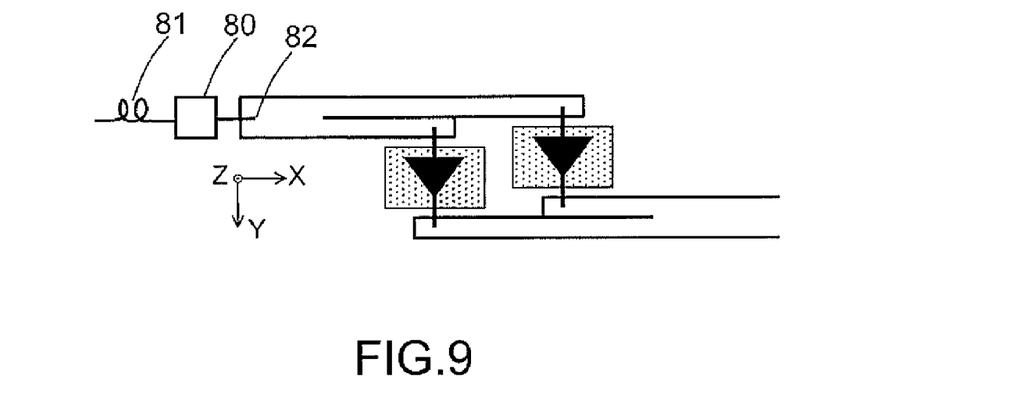
FIG. 9: a schematic example of a feed device for the amplification device, according to the invention.

FIG. 9 shows an exemplary feed device that can be applied at the input of the power amplification device with reduced bulk. The feed device comprises an opto-electronic device 80, for example such as a photodiode or photodiode with amplifier, receiving, by way of an optical fiber 81, a light signal modulated by an RF signal to be amplified. After detection by the photodiode device, the RF signal is transmitted as input to the power divider by way of a transition 82.

The solution proposed in the present description makes it possible to combine a large number of amplifier modules, for example eight amplifiers, in one or more rows and on one or more plates in an antenna grid cell of the order of six centimeters with:

- very low insertion losses of the divider and of the combiner so as not to degrade the efficiency in terms of added power of the device;
- a rectangular waveguide output so as to be directly compatible with the interface of the circuits placed downstream;
- a planar technology input allowing better compatibility with the circuits placed upstream;
- sufficient space around the amplifiers so as to be able to site the decoupling capacitors necessary for the electrical stability of the amplifier;
- very good thermal management so as to adhere to the spatial constraints on the junction temperatures of the semi-conductors;
- reduced bulk so as to minimize the weight of the equipment;
- ease of assembly making it possible to offer a low-cost solution. possible compatibility with systems for transporting RF signals by optical fiber.

Although the invention has been described in conjunction with particular embodiments, it is quite obvious that it is in no way limited thereto and that it comprises all the technical equivalents of the means described as well as their combinations if the latter come within the scope of the invention.

The invention claimed is:

1. An amplification device with reduced bulk comprising at least one plate parallel to a plane XY; and
at least two amplifier modules mounted on the plate, each amplifier module comprising, in order of connection,
an input connection waveguide,
an input transition,
an amplifier element,
an output transition, and
an output connection waveguide, wherein
the input connection waveguide and the output connection waveguide are oriented in the same direction X corresponding to a direction of longitudinal propagation, and
the amplifier element has an input and output axis oriented in a direction Y perpendicular to the direction of propagation X; wherein
the input connection waveguides of the amplifier modules are distinct, have different lengths, and are mounted in parallel to one another;
the output connection waveguides of the amplifier modules are distinct, have different lengths, and are mounted in parallel to one another;
the sum of the lengths of the input and output waveguides of one and the same amplifier module is identical for each amplifier module;
the amplifier modules are mounted in parallel in at least one row;
the input waveguides of the amplifier elements of the row are preceded by a power divider; and
the output waveguides of the amplifier elements of the row being linked to an output power combiner so that the signals transmitted by the output connection waveguides to the power combiner are in phase,
wherein the input divider and/or the output combiner comprises at least one resistive septum which extends walls separating the connection waveguides.

2. The amplification device according to claim 1, wherein the input waveguides, respectively the output waveguides, of the amplifier elements of the row adjoin one another and the amplifier elements of the row are offset with respect to one another in the two perpendicular directions X and Y.

3. The amplification device according to claim 2, further comprising two distinct amplification rows, each amplification row comprising the same number of amplifier modules, the amplifier modules of the first row being mounted symmetrically with respect to the amplifier modules of the second row, on either side of an axis of symmetry parallel to the direction of propagation.

4. The amplification device according to claim 3, wherein each amplifier module of the first row comprises an amplifier element having an input and output axis oriented along the direction Y and aligned respectively with an input and output axis of an amplifier element of an amplifier module of the second row.

5. The amplification device according to claim 4, wherein the output connection waveguides of the amplifier elements of all the amplifier modules of the two rows are distinct, adjoining one another and linked to an output power combiner, common to all the output connection waveguides.

6. The amplification device according to claim 1, wherein the input and output connection waveguides are metallic waveguides with rectangular cross-section.

7. The amplification device according to claim 1, further comprising a first input power divider having two outputs linked respectively to two amplification rows, across two transitions wherein each amplification row comprises a second power divider having outputs linked respectively to each input connection waveguide of the corresponding amplifier modules.

8. The amplification device according to claim 7, wherein the first input power divider has an input of microstrip type.

9. The amplification device according to claim 1, further comprising at least two amplifier modules overlaid one above the other, the amplifier modules being disposed on at least two distinct plates overlaid one above the other and comprising one and the same number of amplifier modules and in that the overlaid amplifier modules have an input guide and an output guide in common.

10. The amplification device according to claim 1, wherein the transition elements are chosen from among fin lines, plungers comprising a metallization line placed on a substrate, or mechanical plungers using a glass bead.

11. The amplification device according to claim 1, wherein the power divider and the power combiner are metallic waveguides with rectangular cross-section.

12. The amplification device according to claim 1, wherein each input connection waveguide is equipped with a phase adjustment element.

13. The amplification device according to claim 1, further comprising an opto-electronic feed device connected at the input of the amplification device by way of an optical fiber and of a transition.

* * * * *